United States Patent
Lepejian et al.

[11] Patent Number: 5,983,009
[45] Date of Patent: Nov. 9, 1999

[54] AUTOMATIC GENERATION OF USER DEFINABLE MEMORY BIST CIRCUITRY

[75] Inventors: Yervant David Lepejian, Palo Alto, Calif.; Hovhannes Ghukasyan, Yerevan, Armenia; Lawrence Kraus, San Jose, Calif.

[73] Assignee: Credence Systems Corporation, Fremont, Calif.

[21] Appl. No.: 08/918,521

[22] Filed: Aug. 21, 1997

Related U.S. Application Data

[60] Provisional application No. 60/028,059, Oct. 3, 1996, and provisional application No. 60/028,060, Oct. 3, 1996.

[51] Int. Cl.$^6$ .................................................... G06F 17/50
[52] U.S. Cl. ................ 395/500.19; 395/500.07; 395/500.11; 714/734; 714/733
[58] Field of Search ................ 395/500, 500.19, 395/500.07, 500.11; 364/490; 714/30, 733, 734

[56] References Cited

U.S. PATENT DOCUMENTS

| | | | |
|---|---|---|---|
| 4,969,148 | 11/1990 | Nadeau-Dostie et al. | 714/718 |
| 5,258,986 | 11/1993 | Zerbe | 714/719 |
| 5,471,482 | 11/1995 | Byers et al. | 714/719 |
| 5,539,652 | 7/1996 | Tegethoff | 364/490 |
| 5,553,082 | 9/1996 | Conner et al. | 714/733 |
| 5,572,712 | 11/1996 | Jamal | 395/500 |
| 5,596,585 | 1/1997 | Njinda et al. | 371/22.5 |
| 5,631,868 | 5/1997 | Termullo, Jr. et al. | 365/200 |
| 5,754,758 | 5/1998 | Baeg et al. | 714/30 |

*Primary Examiner*—Kevin J. Teska
*Assistant Examiner*—Russell W. Frejd
*Attorney, Agent, or Firm*—Smith-Hill and Bedell

[57] ABSTRACT

A method and apparatus are provided for automatically generating the design of a BIST for embedded memories of an IC. The approach relies on counters or pseudo-random generators for the implementation of many of the functions. The invention incorporates software that generates equations that can be used as inputs to a logic synthesis tool. The output of the synthesis tool feeds an automatic routing tool where it is merged with the output of the synthesis of the other portions of the integrated circuit, IC. The routing tool places and routes the signals through the logic described by the synthesis tool along with the remainder of the IC. The result is a completed IC design that includes efficient memory BIST circuitry.

15 Claims, 6 Drawing Sheets

AUTOMATIC GENERATION OF USER DEFINABLE MEMORY BIST CIRCUITRY

CROSS-REFERENCE TO RELATED APPLICATIONS

This application claims priority from the following U.S. Provisional Applications, the disclosures of which, including all appendices and all attached documents, are incorporated by reference in their entirety for all purposes:

Application Ser. No. 60/028,059, filed Oct. 3, 1996; and

Application Ser. No. 60/028,060, filed Oct. 3, 1996.

The following commonly-owned copending application, filed concurrently herewith, is hereby incorporated by reference in its entirety for all purposes:

U.S. patent application Ser. No. 08/917,013 by Yervant David Lepejian et al entitled METHOD AND APPARATUS FOR BUILT-IN SELF TEST OF INTEGRATED CIRCUITS PROVIDING FOR SEPARATE ROW AND COLUMN ADDRESSES.

BACKGROUND OF THE INVENTION

The present invention relates to semiconductor integrated circuits and, more particularly, to test circuits built into the integrated circuits (ICs) that enable efficient testing of embedded memory, especially read/write memory.

As integrated circuits achieve higher and higher levels of integration it is common to find several memory blocks of differing sizes embedded within blocks of logic in the integrated circuit. A typical example of embedded memory is the data and instruction cache memories along with their associated tag and valid data cache memories that are embedded in most modern microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic.

Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs.

Testing of memories is generally accomplished by applying test vectors to the memory and reading back the results to ensure proper memory operation. However, testing an embedded memory through the surrounding logic may require a number of test vectors larger than the available memory available in the automatic test equipment used for testing the device and is, in any case, very time-consuming. It is additionally undesirable because the development of programs to execute such tests require a large amount of skilled test engineering time, which adds to the overhead costs.

Another possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden.

To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used Joint Test Action Group (JTAG) standards. Special test modes which disable the normal operation of the circuit are invoked to enable BIST.

BIST attempts to provide complete fault coverage while minimizing test time and the area of the die that is occupied by the BIST circuitry. In some applications, it is also desirable that diagnostic information be available for faults that are detected. These requirements are in conflict because adding diagnostic capability adds size to the BIST. Various schemes have been developed which optimize one factor at the expense of the others.

One method for reducing the area on the chip devoted to data buses is to use a serial data-in line and a serial data-out line. Buffers are loaded serially and then used for parallel operation during writing, reading and comparison of the results read from the memory with the stored data. A disadvantage to this approach is that the maximum operational frequency is reduced by the width of the data word (e.g. 32 bits), so that the memory is tested at much less than operational frequency. Thus, faults that appear only at normal speed operation, such as capacitive coupling faults and transition faults, are not detected. Another consequence is that the time needed to test the memory is increased by the time necessary to load the buffers serially. This can increase the test time by a factor approximately equal to the width of the memory words.

Another approach is to add multiplexers to the memory input/output lines such that the data read from the memory can be loaded back into adjacent bits during the subsequent write while the memory is in the test mode. Thus, the data from bit 1 is available for writing into bit 2; the data from bit 2 is available for writing into bit 3; etc. The first bit receives new data and the data output from the last bit is routed back to the finite state machine BIST controller for comparison. In operational mode, the multiplexers connect the memory data lines to the chip data bus. Because data is always available for writing when a read operation is completed, the memory may be tested at operational speeds, which increases the quality and accuracy of the test procedure.

Several ways of implementing this scheme are possible. In one possible implementation, the output of the last bit of a word in the first memory is fed into the input of the first bit of a word in the second memory, etc. so as to make all of the memories into effectively one very wide memory for testing purposes. Another implementation involves adding a series of control lines so that each memory can be enabled separately. This allows each memory to be tested sequentially. In the case that the embedded memories are of differing depths, the second method must be used because the first method requires that the memory depths be the same.

There are certain drawbacks to these approaches. For example, although the above implementation offers the advantage of small area utilization, it is nonetheless relatively slow. Furthermore, in the case of a failure, all that is known is the word address of the failure. Information as to which bit failed is not available because the word is structured to operate as a serial shift register with no internal observability. Indeed, in the case that the first proposed method of chaining words in parallel is used, not even the memory that failed can be ascertained. For simple pass or fail testing, it is sufficient to identify that a failure has occurred. However, if redundancy is to be used to repair the failure or if the cause of the failure is to be analyzed, critical information is not available. In fact, if the word were to contain an even number of transition or capacitive coupling faults which cause the bit to read the opposite of the intended data, even the presence of the faults is masked.

An alternate approach is to generate data patterns and address sequences centrally and route them to the embedded memories. This approach is faster than the above serial test approach, especially if several embedded memories are tested in parallel. A drawback to this approach is that routing the extra data and address buses consumes significant amounts of area on the chip as the data path width increases from the historical size of 8 bits to 32 or 64 bits, which are increasingly common. It may not be possible to use the same buses for testing and normal operation because the testing signals should be routed in parallel to the embedded memories while the buses in operation are often separate, e.g. the case of data and instruction caches. This means that testing requires extra buses plus a multiplexer per data and address line.

It has been proposed to reduce the busing area by using a separate pattern generator for each array to be tested and routing only a simple coded instruction from the controller to the pattern generator to instruct the pattern generator which of a set of canned tests stored in the pattern generator to execute. This approach saves on routing area at the expense of the area necessary to create individual pattern generators to test a plurality of memories.

While parallel testing of embedded memories is desirable from a speed standpoint, different embedded memories (e.g. data cache RAM and the associated tag cache RAM) in an integrated circuit are often not of the same size. If two memories of different sizes are tested by being written with the same data pattern, the data in the smaller memory will be overwritten starting with the lower order address space with the data intended to fill the remaining space in the larger memory if the process of writing to the smaller memory is not inhibited when its address space is exceeded. This situation could easily result in incorrect test results for the smaller memory.

One approach that has been proposed to solve this problem is to use the state of the higher order addresses to inhibit the write signal to the smaller memory, which can be efficient in a few special cases. For example, if one memory is smaller in the row direction and the size of the row address space of the smaller memory is a binary multiple (e.g. $2^k$) of the larger array, OR'ing the higher order row addresses that are unused in the smaller memory provides a simple means of generating the needed inhibit signal. However, for the more general case that the smaller array is of an arbitrary size that is not a binary multiple of the larger array, a magnitude comparator is required which becomes prohibitively complex for larger address spaces and consequently consumes an unacceptably large chip area.

A problem that is encountered in the practical implementation of BIST is that, although important to the economic success of a design, its requirements are not directly connected with the system requirements. Because complex integrated circuits have evolved into "systems on a chip", as was the slogan of the 1996 International Solid State Circuits Conference, there are top down methodologies for their definition and design. However, design of the BIST for the memories that are embedded into these circuits tends to be done on an ad hoc basis. The cost of this design is a significant burden, especially for application specific integrated circuits (ASICs) where the design cycle should be short and the manufacturing volumes are relatively low. What is needed is a method for the automatic design of efficient BIST for embedded memories.

SUMMARY OF THE INVENTION

This invention provides a means to automatically generate the design of the BIST for embedded memories. The approach relies on counters or pseudo-random generators for the implementation of many of the functions. The invention incorporates software that generates equations that can be used as inputs to a logic synthesis tool. The output of the synthesis tool feeds an automatic routing tool where it is merged with the output of the synthesis of the other portions of the integrated circuit, IC. The routing tool places and routes the signals through the logic described by the synthesis tool along with the remainder of the IC. The result is a completed IC design that includes efficient memory BIST circuitry.

One embodiment of the present invention provides a method of automatically generating a built-in self test circuit for testing an embedded memory of an integrated circuit chip, the method including the steps of: providing input data indicative of desired BIST features; calculating output data from at least a portion of the input data, the output data indicative of BIST circuit function; synthesizing BIST data from the output data, the BIST data indicative of a BIST circuit incorporating the desired BIST features; providing IC data indicative of a circuit of the IC chip; and synthesizing the BIST data and the IC data to determine placement of circuit blocks on the IC chip and routing between the blocks. This embodiment allows automatic BIST design generation requiring little effort from a user of the method. Thus, complicated BIST design is made simple.

Additionally, the method may include automatically generating a mask for use in manufacturing the integrated circuit chip. This adds to the efficiency of the design, reducing the steps that a circuit designer must take in order to prepare for chip production.

Furthermore, this embodiment provides for duplicating BIST design for similar memories on the chip, and generating alternate designs if memories on the chip are not substantially similar. This accommodates IC chips having various types and sizes of memories, which is common.

Another embodiment of the present invention provides a computer system having a computer program for automatically generating a BIST circuit design for testing an embedded memory of an integrated circuit, the computer system including a computer-readable memory including: code that receives input data indicative of desired BIST features; code that processes the input data and produces output data indicative of BIST operation; code that processes the output data and produces BIST data indicative of BIST circuit components and coupling; code that receives IC data indicative of IC circuit components and coupling; and code that processes the BIST data and IC data and produces layout data indicative of a layout of the IC circuit components and routing between the components.

A further understanding of the nature and advantages of the inventions herein may be realized by reference to the remaining portions of the specification and the attached drawings.

DETAILED DESCRIPTION OF PREFERRED EMBODIMENTS

Figure 1A:
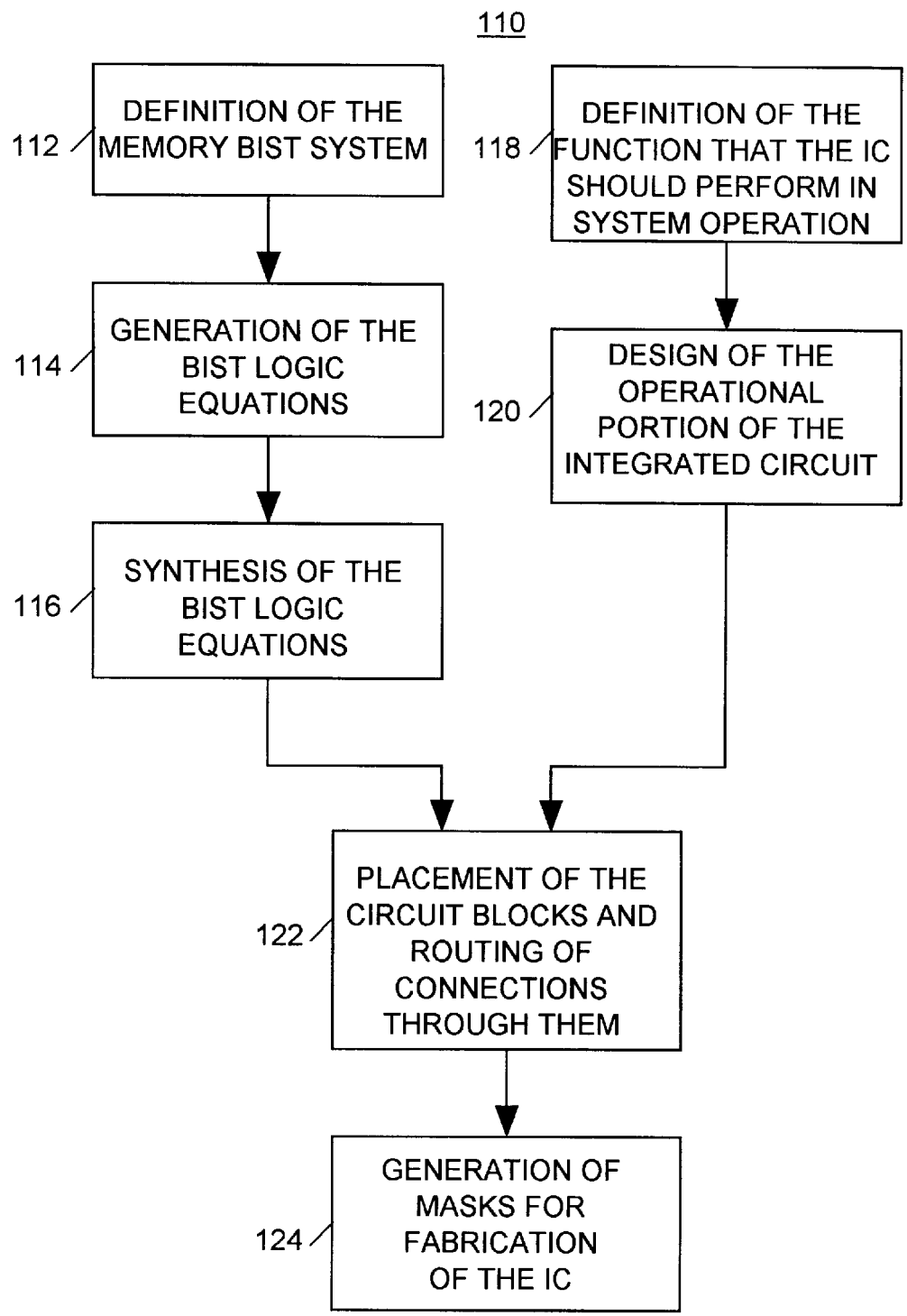
FIG. 1A is a flow chart for a design process for automatically generating an integrated BIST circuit.

FIG. 1A shows a flow chart 110 of the operation of a preferred embodiment of this invention including integration of an overall design of an integrated circuit. It is one of the goals of this invention to make the design of BIST functions compatible with the overall design methodology of the product. Definition of a BIST system to test embedded memory at step 112 supplies information for generating BIST logic equations at step 114. At step 116, the BIST logic equations are synthesized to produce data indicative of a BIST circuit including components and coupling. Independent of the definition of the BIST circuit, step 118 includes defining a function that an IC should perform during system operation, that might include, for example, an arithmetic logic unit of a digital signal processor function. At step 120, the operational portion of the IC is designed. At step 122, the operational and BIST elements of the IC are joined, and the circuit blocks determined in steps 112–120 are placed and routing of connections therebetween determined. At step 124, the placement and routing information is used to generate one or more masks for use in fabricating an IC chip.

Figure 1B:
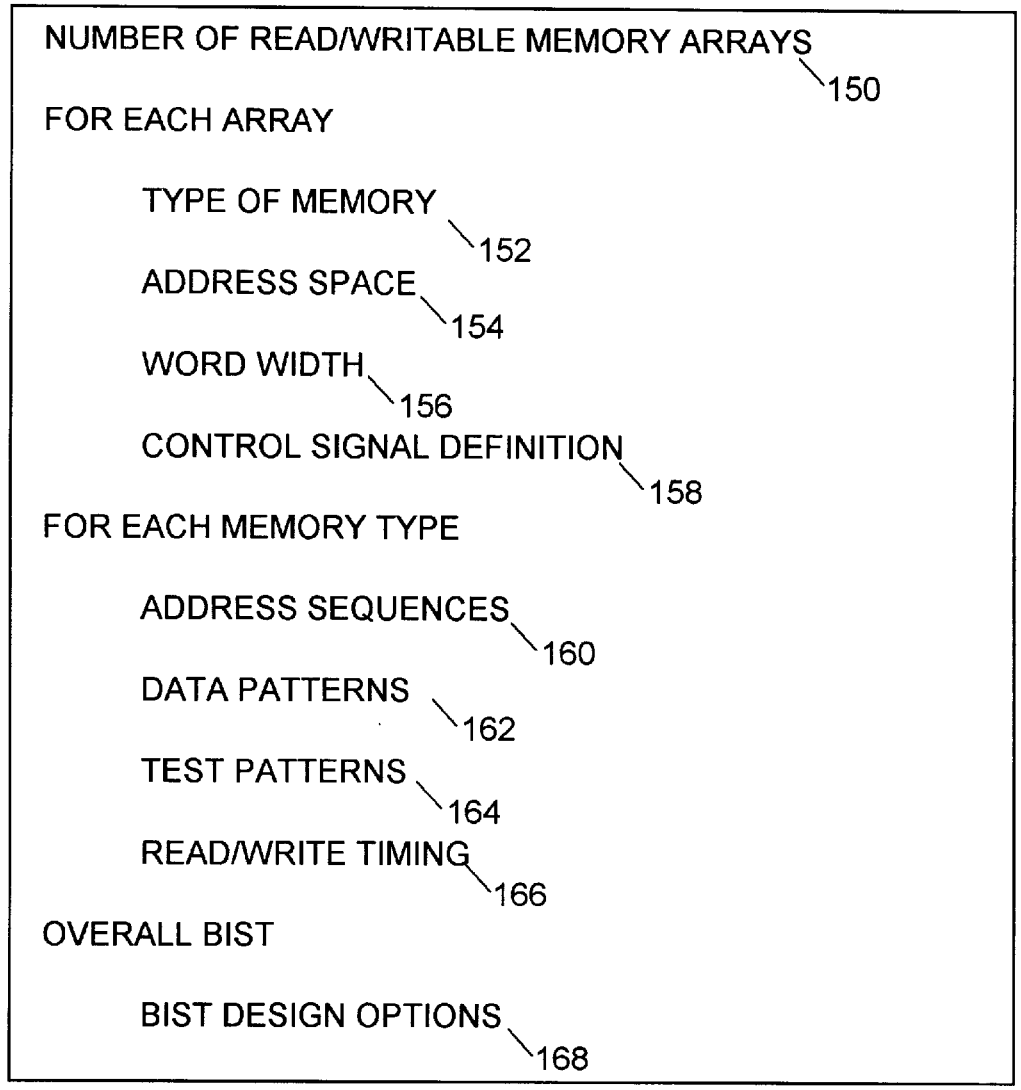
FIG. 1B is a representation of the categories of information which must be supplied in the definition of an integrated BIST circuit.

The definition of the BIST system includes supplying information in categories shown in FIG. 1B. In order to make the application of this invention as easy as possible, this embodiment of the present invention utilizes structured input for the information of FIG. 1B such as pull-down menus or forms to fill in, but this is not necessary.

Type of memory category 152 refers to what type of memory will be tested by the BIST circuit. Types of memory include, but are not limited to, DRAM, SRAM, and EEPROM. The type of memory tested suggests further features of the BIST circuit. For example, the type of memory may indicate what types of control signals are required and what types are unnecessary.

Control signal definition category 158 refers to what control signals are desired, such as "read" or "write." Adding control signals permits more detailed testing and diagnosis with a tradeoff of requiring more chip space for lines to carry the signals.

Address sequences category 160 refers to an order in which addresses within an address space are to be addressed.

Data patterns category 162 refers to a pattern written into a word. For example, a four-word data pattern using sixteen-bit words could be all "0's" (0000 hex), all "1's" (FFFF hex), hex 5555, hex AAAA, etc.

Test pattern category 164 refers to what action sequence (s) is(are) performed during a test. An action sequence may be, for example, read [data pattern 0]/write [data pattern 1]/read [data pattern 1] with a selected address sequence.

BIST design options category 168 refers to user-selectable features of the BIST circuit. These options may include, for example, whether to segment the row and column address spaces as described in a co-pending and co-assigned application Ser. No. 08/917,013 entitled, "Method and Apparatus For Built-In Self Test of Integrated Circuits Providing for Separate Row and Column Addresses," which is hereby incorporated by reference in its entirety for all purposes.

Figure 2:
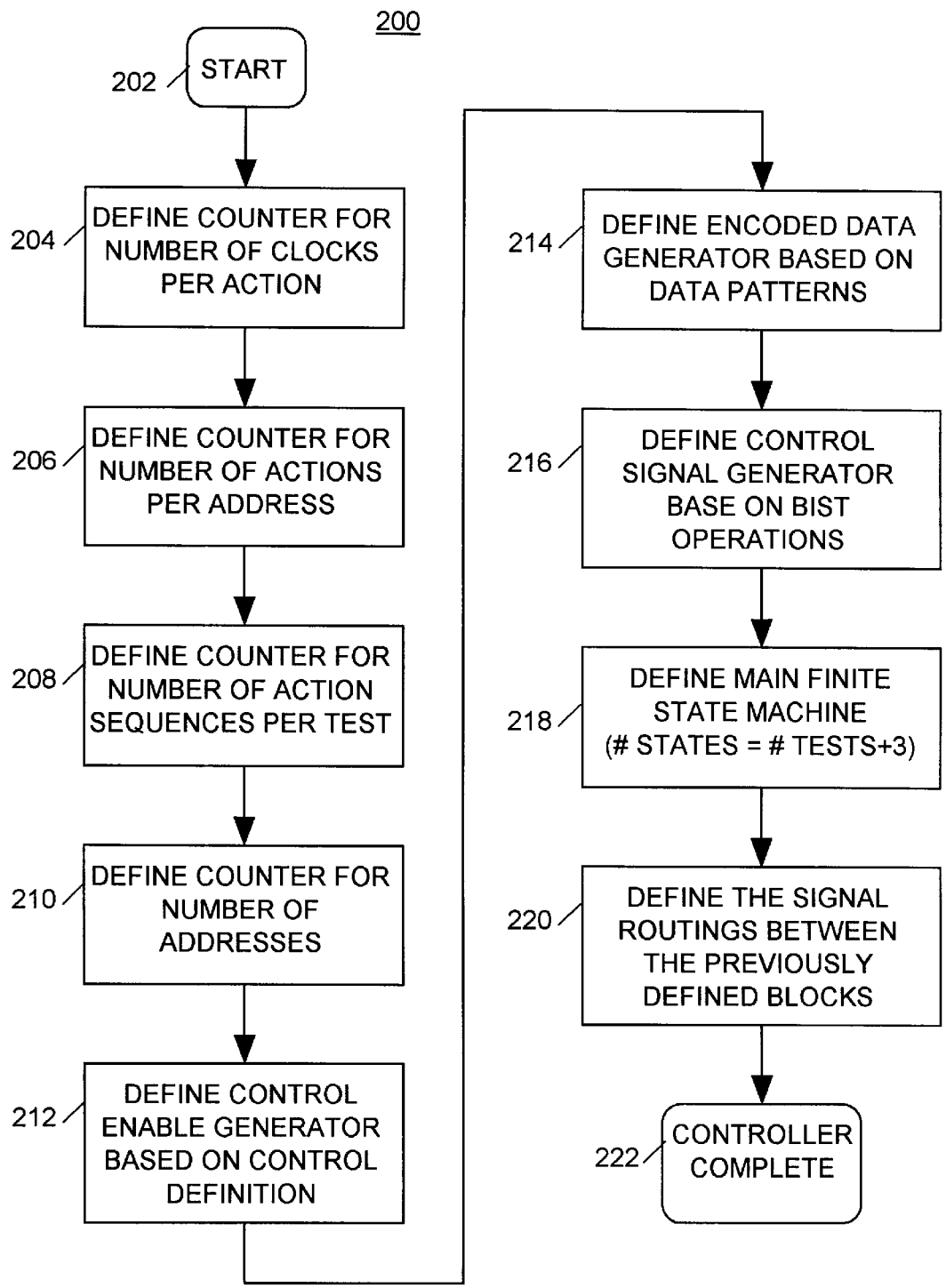
FIG. 2 is a more detailed flow chart for the generation of the memory BIST design equations.

FIG. 2 shows a flow chart 200 for the generation of a main BIST controller.

At step 204 a counter for the number of clocks per action is generated. This counter depends on read/write timing information from the BIST definition (see category 166 of FIG. 1B). The length of the counter may be as low as $\log_2$(number clocks per action). For most memories this results in a counter with a small number of stages. In certain cases, especially involving nonvolatile memory, the counter may have as many as 10 stages. In such cases one may choose to use a linear feedback shift register, LFSR, rather than a ripple counter, but either form of counter would be acceptable.

Other counters are similarly defined for the number of actions per address, the number of action sequences per test, and the number of addresses at steps 206, 208 and 210, respectively. The difference between the number of actions per address and the number of actions per test can be seen by considering an example. Assume that the test consists of writing all "0's", reading all "0's", and writing all "1's" in one address sequence and then reading all "1's", writing all "0's", and reading all "0's" in another address sequence. In this example, there are 3 actions per address (i.e., every address experiences a mixture of three reads and writes before the address changes), but 6 actions per test sequence.

Definition of counter equations follows from knowing the number of items for each counter to count. The number of stages for all of these counters, including the address counter, may be as low as $\log_2$ (number of items counted). From here, known techniques may be used to define the equations for these counters. For example, synthesis software made by Exemplar Logic, Inc., a corporation with headquarters in Alameda, Calif., under the trade name "Leonardo™" can generate the counter equations based upon knowledge of the numbers of items counted.

Definition of a control enable generator occurs at step 212. The control enable generator definition depends upon the control signals selected (see control signal definition category 158 in FIG. 1B). A design of this circuit and those to follow in steps 214–218 may be generated by synthesis software made by Exemplar Logic, Inc., a corporation with headquarters in Alameda, Calif., under the trade name "Leonardo™".

At step 214, an encoded data generator is defined. The encoded data generator equations can be found by the technique described in a related application Ser. No. 08/697, 968, entitled, "Efficient Filtering of Differing Address Spaces in Built-In Self Test For Embedded Memories," also assigned to the assignee of the present application and incorporated herein by reference in its entirety for all purposes.

At step 216, definition of a control signal generator occurs. The control signal generator depends upon the BIST options. Several options for this generator can be designed in advance based on the allowed BIST options. The appropriate design is selected based on the options selected.

At step 218, definition of a finite state machine occurs. The finite state machine depends on the number of tests in a prescribed manner and so its design equations are generated once the number of tests are defined.

Figure 3:
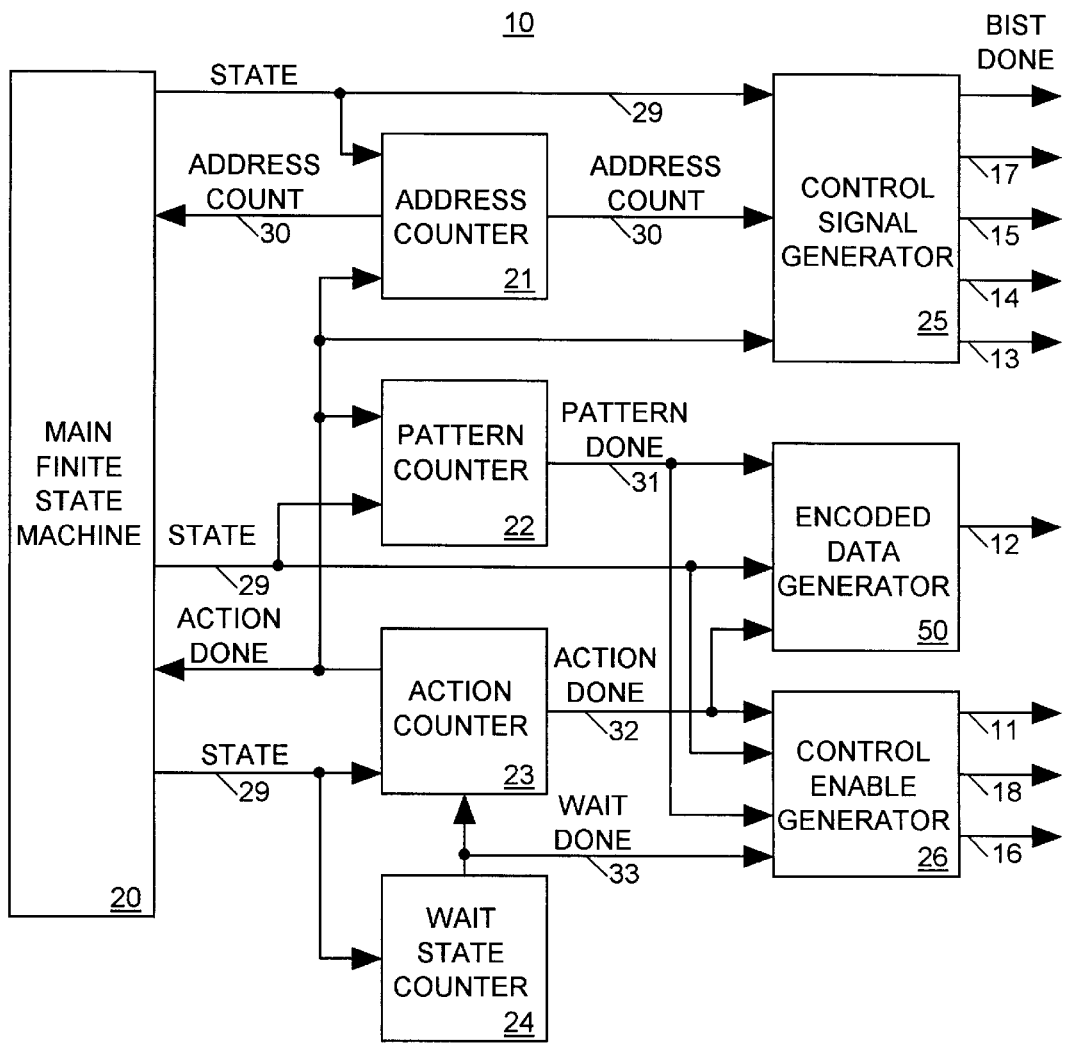
FIG. 3 is a block diagram of the contents of the main controller designed in conformance with the teachings of this invention.

At step 220, definition of signal routings between the previously-defined blocks occurs. An example of the signal routing is shown in FIG. 3. "Cell Ensemble" software made by Cadence Design Systems, Inc., a corporation with headquarters in San Jose, Calif., can determine circuit block placement and signal routing between the circuits blocks. This same software may be used to determine circuit block placement and routing of the integrated BIST and IC circuitry (see step 122 of FIG. 1A).

FIG. 3 shows a block diagram of a main controller 10. The main controller includes, primarily, counters because counters can be designed that are both compact (i.e., occupy small layout area) and capable of operation at full operational clock speed. In this circuit a main finite state machine 20 drives four counters 21, 22, 23, and 24 with a state signal 29. A wait state counter 24 counts the number of clocks per action and passes the results to an action counter 23 and the control enable generator 26. The action counter counts the number of different actions per address and passes the results to the main finite state machine 20, the control enable generator, an encoded data generator 50, a pattern counter 22, an address counter 21, and a generator of control signals for other modules 25.

The address counter receives the state signal and an action done signal 32 and generates an address count 30 that is passed to the control signal generator (e.g., a small block of combinatorial logic) that combines this signal with the state signal and the action done signal to generate a BIST done signal, a diagnosis/shift signal 17, an address clock signal 13, an address initialize signal 14 and an address reset signal 15. These signals are all sent to the distributed BIST circuitry located near the memory blocks that are to be tested.

The encoded data generator receives the pattern complete, the state, and the action complete signals and generates encoded data patterns. This encoded data is sent to a decoder 60 (see FIG. 5) located near the memories to be tested.

The control enable generator 26 combines the state, action complete, pattern complete, and wait complete signals to form a control enable signal 11, an increment/decrement signal 16, and a read enable signal 18. These signals are also sent to the distributed BIST circuitry (see FIG. 5 and related discussion).

Figure 4:
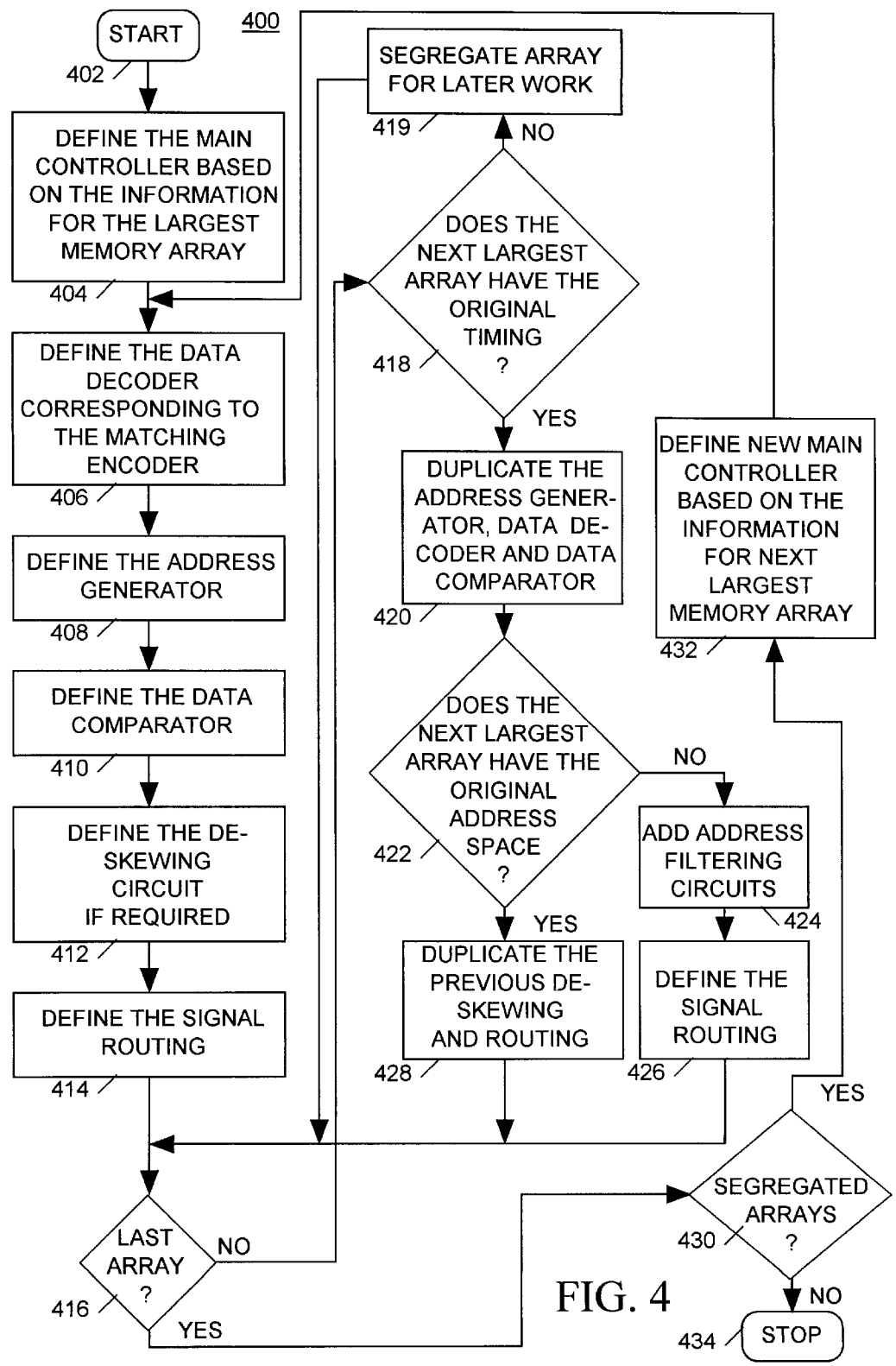
FIG. 4 is a flow chart indicating the procedure f used in defining the logic equations for the BIST implementation.

A method 400 for generating the equations for the remaining BIST circuitry is illustrated in FIG. 4. The process begins at step 402 and proceeds to step 404 for defining of the main controller for the largest array in the manner described previously. Equations for the data decoder corresponding to the data encoder in the main controller are generated next at step 406. At steps 408 and 410, respectively, an address generator and data comparator are defined. The address generator and data comparator can be defined according to the teachings of related applications Ser. No. 08/707,062, entitled "Efficient Built-In Self Test For Embedded Memories With Differing Address Spaces," and Ser. No. 08/697,969, entitled "Method and Apparatus for Built-In Self Test of Integrated Circuits," also assigned to the assignee of the present application and incorporated herein by reference in their entirety for all purposes. If the design options call for a de-skewing circuit to be defined at step 412, an appropriate design is suggested in the related applications, Ser. No. 08/697,968 and co-pending and co-assigned application Ser. No. 08/917,013 entitled, "Method and Apparatus For Built-In Self Test of Integrated Circuits Providing for Separate Row and Column Addresses," (both referenced above). Then, at step 414, the routing can be defined. This completes the design of the BIST circuitry for this array. The remainder of FIG. 4 will be discussed below in connection with the operation of this embodiment of the present invention.

Figure 5:
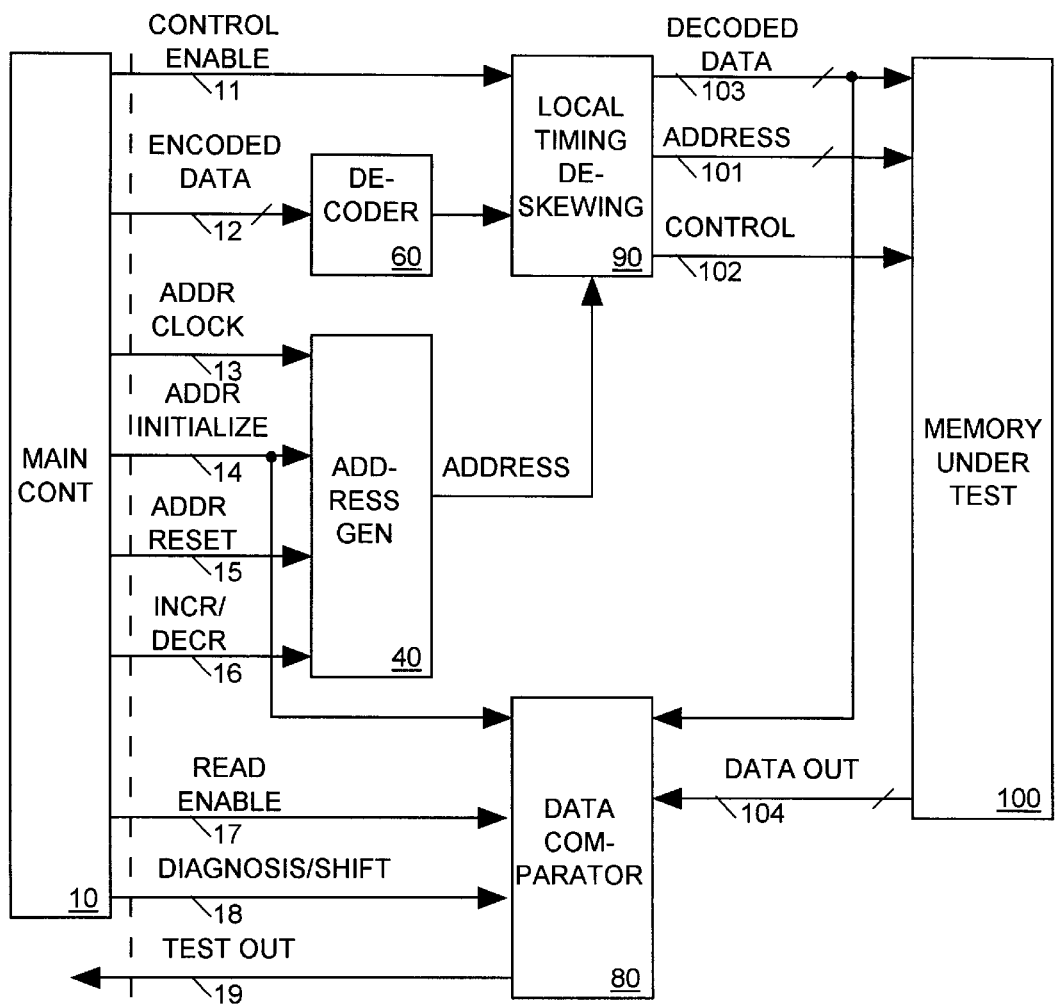
FIG. 5 is an overall block diagram of a BIST circuit and routing connections designed in accordance with the teachings of this invention.

An embodiment of a design in accordance with the teaching of this invention is shown in FIG. 5. A BIST circuit such as the one shown in FIG. 5 can be generated by a logic synthesizer that receives input data in a design language describing the function to be performed. Those lines that are actually buses are indicated by having a diagonal line across them, e.g., decoded data signal 103 between local timing de-skewing circuit 90 and a memory under test 100. The main controller 10 is shown to the left of the dashed line. Blocks that appear to the right of the dashed line are distributed, one per embedded memory tested. Shown are the local logic blocks associated with a memory. In general there will be one of these local logic blocks for each memory. The blocks that are distributed for the BIST function are an address generator 40, a data decoder 60, a data comparator 80, and a local timing de-skewing circuit 90. In the embodiment shown, only one of the lines running from the central controller to the distributed blocks is a bus, encoded data line 12. Even for this bus, the number of lines in the bus is less than or equal to log2 (number of patterns) for an encoding circuit that properly minimizes the width of the encoded data bus as shown in a related application Ser. No. 08/697,969 (referenced above). The small number of lines required to be routed helps make this invention efficient.

The main controller coordinates and synchronizes the tests that are conducted on the individual memories. Address clock signal 13, address initialization signal 14, address reset signal 15, and increment/decrement signal 16 control generation of the addresses for the memory.

The decoder 60 decodes the pattern information and provides data to the memory under test 100. This data is decoded and asserted onto the data bus 103. The signals on the data bus, an address bus 101 and a control line 102 exercise the memory by writing and reading from all of the memory locations in both polarities with differing address sequences.

The local timing de-skewing circuit 90 provides pulse shaping and edge placement for the address, control, and decoded data signals for each local memory. The de-skewing circuit reduces problems associated with accessing different embedded memories that may be separated by distances that might create timing problems, such as a centimeter or more. Some cases may not require this circuitry, further reducing the chip area used in the implementation of this invention.

The data comparator 80 compares data read out of the memory 100 with the corresponding input data and reports the results, pass/fail, under the control of a read enable signal 18 and a diagnosis/shift signal 17. Should the information be deemed valuable, the addition of two lines allows the data comparator to report the address location of any failing bits back to the controller. This information can be combined with information as to what pattern and data polarity caused the failure and reported to an external tester for further analysis, redundancy repair or other actions.

Returning to FIG. 4, after the equations for BIST circuitry for the largest array are found, a check is made to see if there are more arrays at step 416. If more arrays exist, the next largest array is selected.

At step 418, a check is made as to whether the next largest array has the timing of the array for which the BIST design has been completed.

If the timings of the two arrays are different, then the next largest array is segregated for later work at step 419. Array timings may differ, for example, when SRAM and nonvolatile memory are embedded on the same IC.

If the timings of the two arrays are the same, then the process proceeds to step 420, where the address generator, and data comparator are duplicated. Because the cost of extra unused data patterns is low, good design practice suggests that the data patterns for arrays with common timing be common. There is no requirement that the test patterns use all of the available data patterns. This allows all arrays with common timing to use the same controller and encoded data bus and to conduct the tests at the same time.

After duplicating the address generator, data decoder, and data comparator, a check is made at step 422 as to whether the next largest array has the same address space as its predecessor.

If the address spaces of the two arrays are different, then the process adds address filtering circuits at step 424 and defines the signal routing at step 426. An example of address filtering is described in a related application Ser. No. 08/967, 968 (referenced above).

If the address spaces of the two arrays are the same, then the equations for de-skewing and routing the previous array are duplicated at step 428.

The process then returns to step 416 and checks to see if there are any more arrays. If there are, then the loop continues.

After there are no more arrays having the timing of the original array for which to generate the BIST design equations, a check is made at step 430 to see if any arrays were segregated because of a different timing set. If there were, then the equations for a second main controller will be generated at step 432. Then, the same path is followed to generate the equations for the other BIST circuitry beginning at step 406. This process continues until the design equations are found for all the BIST circuitry, at which point the process stops at step 434.

The above description is illustrative and not restrictive. Many variations of the invention will become apparent to those of skill in the art upon review of this disclosure. For example, many address spaces and other data patterns may be used, which would result in different logic equations and logic diagrams. Moreover, the same logic functions may be realized in a number of ways. The scope of the invention should, therefore, be determined not with reference to the above description, but instead with reference to the appended claims along with their full scope of equivalents.

What is claimed is:

1. A method for generating an integrated circuit (IC) including an operational circuit comprising a plurality of embedded memories (100) accessed by said operational circuit, said embedded memories having differing address ranges, the method comprising the steps of:
   a. providing a first specification for a plurality of built-in self-test (BIST) circuits (40, 60, 80, 90), each corresponding to a separate one of said embedded memories, each for responding to input timing signals by generating an address sequence, writing data to and reading data from the corresponding embedded memory at each address of said address sequence, comparing data written into the corresponding embedded memory to data read out of the corresponding embedded memory, and producing output data indicating whether the data written into the embedded memory matches the data read out of the embedded memory, wherein said timing signals include a first timing signal (11) for controlling timing of memory access and a second timing signal (13) for controlling timing of generation of each address of said address sequence;
   b. providing a second specification for a BIST controller for generating and supplying said first and second timing signals in common to all of said BIST circuits;
   c. synthesizing IC design of circuit blocks implementing each of said BIST circuits in accordance with said first specification and also implementing said operational circuit;
   d. determining placement and interconnections of said circuit blocks within said IC; and
   e. generating said IC in accordance with said design of said circuit blocks synthesized at step c and placement and interconnections of said circuit blocks determined at step d.

2. The method in accordance with claim 1 wherein said circuit blocks synthesized in step c also implement said BIST controller in accordance with said second specification.

3. The method in accordance with claim 1 wherein each of said BIST circuits corresponding to an embedded memory includes an address generator (40) for responding to pulses of said second timing signal by generating a sequence of memory addresses spanning without exceeding a memory address range of the corresponding embedded memory.

4. The method in accordance with claim 1 wherein said BIST controller also generates and supplies a sequence of encoded data values (12) in common to each said BIST circuit and wherein each BIST circuit decodes said sequence of encoded data values to produce data that it writes to its corresponding RAM.

5. The method in accordance with claim 1 wherein each of said BIST circuits responds to said first timing signal by accessing its corresponding RAM with a delay, and wherein said first specification separately specifies that delay for each BIST circuit.

6. The method in accordance with claim 2 wherein each of said BIST circuits corresponding to an embedded memory includes an address generator (40) for responding to pulses of said second timing signal by generating a sequence of memory addresses spanning without exceeding a memory address range of the corresponding embedded memory.

7. The method in accordance with claim 2 wherein said BIST controller also generates and supplies a sequence of encoded data values (12) in common to each said BIST circuit and wherein each BIST circuit decodes said sequence of encoded data values to produce data that it writes to each address of its corresponding RAM.

8. The method in accordance with claim 2 wherein each of said BIST circuits responds to said first timing signal by accessing its corresponding RAM with a delay, and wherein said first specification separately specifies that delay for each BIST circuit.

9. The method in accordance with claim 3 wherein said BIST controller also generates and supplies a sequence of encoded data values (12) in common to each said BIST circuit and wherein each BIST circuit decodes said sequence of encoded data values to produce data that it writes to each address of its corresponding RAM.

10. The method in accordance with claim 3 wherein each of said BIST circuits responds to said first timing signal by accessing its corresponding RAM with a delay, and wherein said first specification separately specifies that delay for each BIST circuit.

11. The method in accordance with claim 6 wherein each of said BIST circuits responds to said first timing signal by accessing its corresponding RAM with a delay, and wherein said first specification separately specifies that delay for each BIST circuit.

12. The method in accordance with claim 6 wherein said BIST controller also generates and supplies a sequence of encoded data values (12) in common to each said BIST circuit and wherein each BIST circuit decodes said sequence of encoded data values to produce data that it writes to each address of its corresponding RAM.

13. The method in accordance with claim 6 wherein each of said BIST circuits responds to said first timing signal by accessing its corresponding RAM with a delay, and wherein said first specification separately specifies that delay for each BIST circuit.

14. The method in accordance with claim 9 wherein said BIST controller also generates and supplies a sequence of encoded data values (12) in common to each said BIST circuit and wherein each BIST circuit decodes said sequence of encoded data values to produce data that it writes to each address of its corresponding RAM.

15. The method in accordance with claim 12 wherein each of said BIST circuits responds to said first timing signal by accessing its corresponding RAM with a delay, and wherein said first specification separately specifies that delay for each BIST circuit.

* * * * *